US005569568A

United States Patent [19]

DeBoer

[11] Patent Number: 5,569,568

[45] Date of Patent: *Oct. 29, 1996

[54] METHOD FOR USING A LASER ABLATIVE RECORDING ELEMENT WITH LOW RED OR GREEN ABSORPTION AS A REPROGRAPHIC PHOTOMASK

[75] Inventor: Charles D. DeBoer, Rochester, N.Y.

[73] Assignee: Eastman Kodak Company, Rochester, N.Y.

[ * ] Notice: The term of this patent shall not extend beyond the expiration date of Pat. No. 5,429,909.

[21] Appl. No.: 357,970

[22] Filed: Dec. 16, 1994

[51] Int. Cl.[6] .......... G03F 9/00

[52] U.S. Cl. .......... 430/5; 430/945; 430/270.1; 428/195; 428/913; 428/914

[58] Field of Search .......... 503/227; 428/195, 428/913, 914; 430/200, 201, 944, 270, 945, 9, 5

[56] References Cited

U.S. PATENT DOCUMENTS

| | | | |
|---|---|---|---|
| 2,940,852 | 6/1960 | Herrick et al. | 430/181 |
| 4,923,860 | 5/1990 | Simons | 503/227 |
| 4,973,572 | 11/1990 | DeBoer | 430/201 |
| 5,156,938 | 10/1992 | Foley et al. | 430/200 |
| 5,168,093 | 12/1992 | Takuma et al. | 428/913 |
| 5,229,353 | 7/1993 | Vanmaele et al. | 430/945 |
| 5,256,506 | 10/1993 | Ellis et al. | 430/201 |
| 5,262,275 | 11/1993 | Fan | 430/945 |
| 5,429,909 | 7/1995 | Kaszczuk et al. | 430/201 |

*Primary Examiner*—Martin J. Angebranndt
*Attorney, Agent, or Firm*—Harold E. Cole

[57] ABSTRACT

A process for using laser dye-ablative recording element having high blue and ultraviolet contrast comprising a support having thereon a dye layer comprising a blue-absorbing dye, an ultraviolet-absorbing dye and an image dye dispersed in a polymeric binder, the dye layer having an infrared-absorbing material associated therewith to absorb at a given wavelength of the laser used to expose the element, the image dye being substantially transparent in the infrared region of the electromagnetic spectrum and absorbing in the region of from about 450 to about 700 nm and not having substantial absorption at the wavelength of the laser used to expose the element, the element having:

a) an optical density of greater than about 2.0 in each of the ultraviolet and blue regions of the spectrum; and b) a sum of optical densities in the red and green regions of the spectrum of at least about 1 and up to about 3.0 as a reprographic photomask.

5 Claims, No Drawings

METHOD FOR USING A LASER ABLATIVE RECORDING ELEMENT WITH LOW RED OR GREEN ABSORPTION AS A REPROGRAPHIC PHOTOMASK

This invention relates to use of certain image dyes in a single-sheet laser dye-ablative recording element and more particularly to preparing graphic arts films by direct laser-writing.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. Usefulness of such an ablative element is largely determined by the efficiency at which the imaging dye can be removed on laser exposure. The transmission Dmin value is a quantitative measure of dye clean-out: the lower its value at the recording spot, the more complete is the attained dye removal.

In the art of lithographic printing, it is necessary to make four color separations of the image being printed. These separations are then used to expose photosensitive lithographic printing plates. These color separations need to be physically registered with respect to one another prior to exposure of the litho plate so that the resulting color records are accurately printed. This is usually done by overlapping the separations on a light table.

For example, in the conventional registration process, the color separations are aligned on top of one another and registration holes are punched into the edges of the films. Since the separations consist of imaged silver halide films of high density and contrast, it is difficult, if not impossible, to see through the top separation when aligning it with the bottom separation.

One way of easing visual alignment of color separations is to prepare diazo copies of the separations are being used, as disclosed in U.S. Pat. No. 2,940,852. This involves contact exposure of the silver halide separation with diazo film, followed by diazo film processing chemistry. It is an object of this invention to find a simpler way of solving this visual alignment problem.

It is another object of this invention to provide a single-sheet process which does not require a separate receiving element.

These and other objects are achieved in accordance with the invention which comprises a laser dye-ablative recording element having high blue and ultraviolet contrast comprising a support having thereon a dye layer comprising a blue-absorbing dye, an ultraviolet-absorbing dye and an image dye dispersed in a polymeric binder, the dye layer having an infrared-absorbing material associated therewith to absorb at a given wavelength of the laser used to expose the element, the image dye being substantially transparent in the infrared region of the electromagnetic spectrum and absorbing in the region of from about 450 to about 700 nm and not having substantial absorption at the wavelength of the laser used to expose the element, the element having:

a) an optical density of greater than about 2.0 in each of the ultraviolet and blue regions of the spectrum; and b) a sum of optical densities in the red and green regions of the spectrum of at least about 1 and up to about 3.0.

The elements of this invention, when exposed to laser-writing, will result in graphic arts images with a high degree of visual transparency and the desired contrast in both the blue and ultraviolet regions of the spectrum, and with low contrast in at least part of the red and green regions of the spectrum.

The dye ablation elements of this invention can be used to obtain medical images, reprographic masks, printing masks, etc. The image obtained can be a positive or a negative image.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

Any image dye can be used in the ablative recording element employed in the invention provided it can be ablated by the action of the laser and absorbs in the region of from about 450 to about 700 nm. Especially good results have been obtained with dyes such as anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, (products of Nippon Kayaku Co., Ltd.); direct dyes such as Direct Dark Green B® (product of Mitsubishi Chemical Industries, Ltd.) and Direct Brown M® (product of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

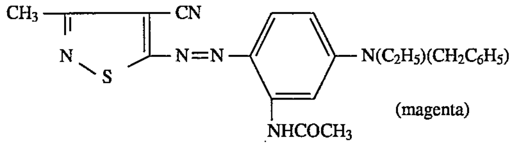
(magenta)

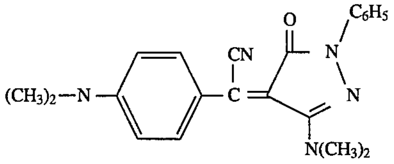
(magenta)

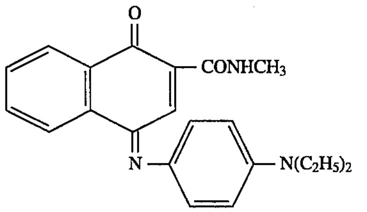
(cyan)

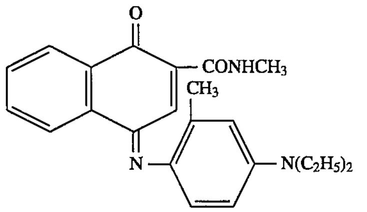
(cyan)

or any of the dyes absorbing in the region of from about 450 to about 700 nm disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 g/m$^2$ and are preferably hydrophobic.

The ultraviolet-absorbing dye useful in the invention can be any dye which absorbs in the ultraviolet and is useful for the intended purpose. Examples of such dyes are found in Patent Publications: JP 58/62651; JP 57/38896; JP 57/132154; JP 61/109049; JP 58/17450; and DE 3,139,156, the disclosures of which are hereby incorporated by reference. They may be used in an amount of from about 0.05 to about 1.0 g/m$^2$.

The blue-absorbing dye useful in the invention can be any dye which absorbs in the blue region of the spectrum, e.g., a yellow dye, and is useful for the intended purpose. Examples of such dyes are found in U.S. Pat. Nos. 4,973,572; 4,772,582 and 4,876,235, the disclosures of which are hereby incorporated by reference. They may be used in an amount of from about 0.1 to about 1.0 g/m$^2$.

The dye layer of the ablative recording element employed in the invention may be coated on the support or printed thereon by a printing technique such as a gravure process.

As noted above, the element has an optical density of greater than about 2.0 in each of the ultraviolet and blue regions of the spectrum. If the element has a density of less than 2.0, it would have insufficient contrast to accurately prepare a litho plate. When a sensitized litho plate is prepared, there must be sufficient exposure in the clear areas of the image to completely change the sensitive layer from the unexposed to the exposed form, while maintaining the dark areas of the image in the unexposed form. Some overexposure in the clear areas is desirable to guarantee good press performance, and at the same time, there must be minimal exposure in the dark areas to obtain the best press performance. This requires a contrast ratio of about 100 to 1, or, in optical density units, an optical density of about 2.0.

Also as noted above, the element has a sum of optical densities in the red and green regions of the spectrum of at least about 1 and up to about 3.0. If the sum of optical densities were less than 1, the visual contrast would be too low to easily align overlapping color separations. If the sum of optical densities were greater than about 3.0, then there would be insufficient transmitted light from a light table to easily align overlapping color separations.

Any polymeric material may be used as the binder in the recording element employed in the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly (vinyl acetate); polystyrene; poly (styrene-co-acrylonitrile); a polysulfone; a poly (phenylene oxide); a poly (ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 g/m$^2$.

In a preferred embodiment, the polymeric binder used in the recording element employed in the process of the invention has a polystyrene equivalent molecular weight of at least 100,000 as measured by size exclusion chromatography, as described in U.S. Pat. No. 5,330,876, the disclosure of which is hereby incorporated by reference.

A barrier layer may be employed in the laser ablative recording element of the invention if desired, as described in U.S. Pat. No. 5,459,017, the disclosure of which is hereby incorporated by reference.

To obtain a laser-induced, dye ablative image according to the invention, a diode laser is preferably employed since it offers substantial advantages in terms of its small size, low cost, stability, reliability, ruggedness, and ease of modulation. In practice, before any laser can be used to heat a dye-ablative recording element, the element must contain an infrared-absorbing material, such as cyanine infrared-absorbing dyes as described in U.S. Pat. No. 5,401,618 or other materials as described in the following U.S. Pat. Nos. 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. Preferably, the laser exposure in the process of the invention takes place through the dye side of the dye ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

The dye in the recording element of the invention may be used at a coverage of from about 0.01 to about 1 $g/m^2$.

The dye layer of the dye-ablative recording element of the invention may be coated on the support or printed thereon by a printing technique such as a gravure process.

Any material can be used as the support for the dye-ablative recording element of the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly-(tetrafluoroethylene-co-hexfluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

The following materials are employed below:

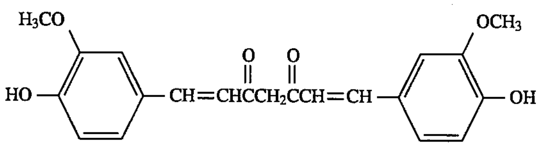

Curcumin Yellow Dye

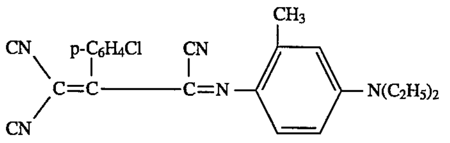

Cyan Dye

-continued

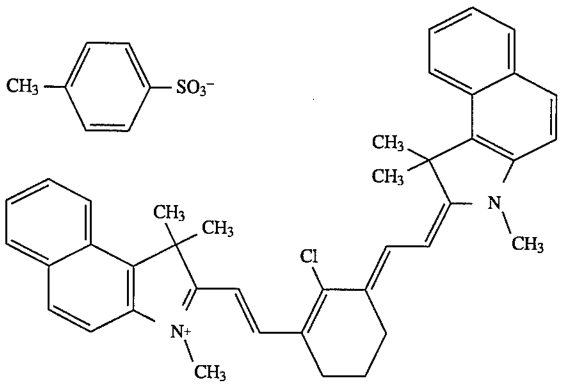

IR - Absorbing Dye

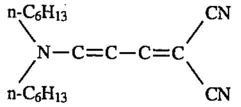

Liquid UV-Absorbing Dye

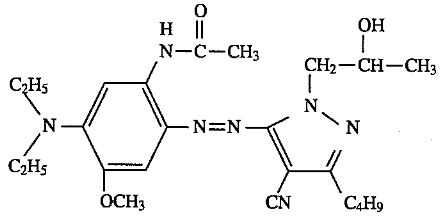

Magenta Dye

A clear green film was prepared by coating a 100 μm poly(ethylene terephthalate) film support with 0.56 $g/m^2$ nitrocellulose binder, 0.15 $g/m^2$ of the cyan dye depicted above, 0.26 $g/m^2$ curcumin yellow dye, 0.12 $g/m^2$ liquid UV-absorbing dye, and 0.2 $g/m^2$ IR-absorbing dye, the structures of which are shown above.

Status A optical densities on the above film were measured using an X-Rite Densitometer (Model 310, X-Rite Corp.) with the following results:

| STATUS A OPTICAL DENSITY | | | RED + | RATIO |
|---|---|---|---|---|
| RED | GREEN | BLUE | GREEN | R/G |
| 1.98 | 0.45 | 3.33 | 2.43 | 4.4 |

The film was ablation-written using Spectra Diode Labs Laser Model SDL-2432, having integral, attached fiber for the output of the laser beam with a wavelength range of 800–830 nm and a nominal power output of 250 mW. at the end of the optical fiber. The cleaved face of the optical fiber was imaged onto the plane of the dye ablative element with a 0.5 magnification lens assembly mounted on a translation stage giving a nominal spot size of 25 μm.

The drum, 53 cm in circumference, was rotated at 100 rev/min and the imaging electronics were activated to print an image. The translation stage was incrementally advanced across the dye ablation element by means of a lead screw turned by a microstepping motor, to give a center-to-center line distance of 10 μm (945 lines per centimeter, or 2400 lines per inch). An air stream was blown over the dye ablation element surface to remove the ablated dye. The ablated dye and other effluents are collected by suction. The measured total power at the focal plane was 100 mW.

When overlaid on a light box with a second image made the same way, the images were easily aligned by visual inspection.

EXAMPLE 2

A film was prepared and exposed in the same way as shown in Example 1, except that the cyan dye was replaced by the magenta dye above to provide a clear red film. The following results were obtained:

| STATUS A OPTICAL DENSITY | | | RED + | RATIO |
|---|---|---|---|---|
| RED | GREEN | BLUE | GREEN | R/G |
| 0.26 | 2.31 | 3.51 | 2.57 | 8.9 |

Again, visual alignment of the film was easy because of the clear red color of the film.

The invention has been described in detail with particular reference to preferred embodiments thereof, but it will be understood that variations and modifications can be effected within the spirit and scope of the invention.

What is claimed is:

1. A single sheet process of forming a reprographic mask in the absence of a separate receiving element and using said reprographic mask comprising:

a) imagewise-exposing by means of a laser, a dye-ablative recording element having high blue and ultraviolet contrast comprising a transparent support having thereon a dye layer comprising a blue-absorbing dye, an ultraviolet-absorbing dye and an image dye dispersed in a polymeric binder, said dye layer having an infrared-absorbing material associated therewith to absorb at a given wavelength of the laser used to expose said dye-ablative recording element, causing imagewise ablation of the dye layer, said image dye being substantially transparent in the infrared region of the electromagnetic spectrum and absorbing in the region of from about 450 to about 700 nm and not having substantial absorption at the wavelength of said laser used to expose said element, said laser exposure taking place through the dye layer side of said dye-ablative recording element, wherein said dye-ablative recording element has:

I) an optical density of greater than about 2.0 in each of the ultraviolet and blue regions of the spectrum; and II) a sum of optical densities in the red and green regions of the spectrum of at least about 1 and up to about 3.0;

b) removing the ablated dye layer areas by means of an air stream to obtain said reprographic mask;

c) placing said reprographic mask over a photosensitive material; and d) exposing the masked photosensitive material to an ultraviolet or blue light source.

2. The process of claim 1 wherein the ratio of said optical densities in the red and green regions of the spectrum is greater than about 2.

3. The process of claim 1 wherein said optical density in each of the ultraviolet and blue regions of the spectrum is greater than about 3.0.

4. The process of claim 3 wherein the ratio of said optical densities in the red and green regions of the spectrum is greater than about 2.

5. The process of claim 1 wherein said infrared-absorbing material is a dye which is contained in said dye layer.

* * * * *